United States Patent
Kittl et al.

(10) Patent No.: US 10,283,638 B2
(45) Date of Patent: May 7, 2019

(54) STRUCTURE AND METHOD TO ACHIEVE LARGE STRAIN IN NS WITHOUT ADDITION OF STACK-GENERATED DEFECTS

(71) Applicants: Jorge A. Kittl, Round Rock, TX (US);
Ganesh Hegde, Austin, TX (US);
Robert C. Bowen, Austin, TX (US);
Mark S. Rodder, Dallas, TX (US)

(72) Inventors: Jorge A. Kittl, Round Rock, TX (US);
Ganesh Hegde, Austin, TX (US);
Robert C. Bowen, Austin, TX (US);
Mark S. Rodder, Dallas, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/086,015

(22) Filed: Mar. 30, 2016

(65) Prior Publication Data
US 2017/0040455 A1 Feb. 9, 2017

Related U.S. Application Data

(60) Provisional application No. 62/200,335, filed on Aug. 3, 2015.

(51) Int. Cl.
| | |
|---|---|
| *H01L 21/336* | (2006.01) |
| *H01L 29/78* | (2006.01) |
| *H01L 29/06* | (2006.01) |
| *H01L 29/66* | (2006.01) |

(52) U.S. Cl.
CPC ...... *H01L 29/7849* (2013.01); *H01L 29/0673* (2013.01); *H01L 29/66666* (2013.01)

(58) Field of Classification Search
CPC ......... H01L 29/78; H01L 29/66; H01L 29/06; H01L 29/7849; H01L 29/0673; H01L 29/66666
See application file for complete search history.

(56) References Cited

U.S. PATENT DOCUMENTS

| | | | |
|---|---|---|---|
| 7,700,416 B1 | 4/2010 | Clifton et al. | |
| 8,492,208 B1 | 7/2013 | Cohen et al. | |
| 9,023,705 B1 | 5/2015 | Paul et al. | |
| 9,484,353 B1 * | 11/2016 | Lai | H01L 27/11556 |
| 9,653,289 B1 * | 5/2017 | Balakrishnan | H01L 27/088 |

(Continued)

*Primary Examiner* — Charles D Garber
*Assistant Examiner* — Abdulfattah Mustapha
(74) *Attorney, Agent, or Firm* — Rennissance IP Law Group LLP

(57) ABSTRACT

A stack for a semiconductor device and a method for making the stack are disclosed. The stack comprises a plurality of sacrificial layers in which each sacrificial layer comprises a first lattice parameter; and at least one channel layer comprising a second lattice parameter that is different from the first lattice parameter and in which each channel layer is disposed between and in contact with two sacrificial layers. The stack is formed on an underlayer in which a sacrificial layer is in contact with the underlayer. The underlayer comprises a third lattice parameter that substantially matches the lattice parameter that the plurality of sacrificial layers and the at least one channel layer would have if the plurality of sacrificial layers and the at least one channel layer were was allow to relax coherently.

6 Claims, 4 Drawing Sheets

(56) References Cited

U.S. PATENT DOCUMENTS

| | | | |
|---|---|---|---|
| 2004/0115916 A1* | 6/2004 | Lochtefeld | C30B 25/18 438/597 |
| 2014/0008714 A1* | 1/2014 | Makala | H01L 21/28273 257/324 |
| 2014/0084357 A1* | 3/2014 | Choi | H01L 27/1157 257/324 |
| 2014/0225065 A1* | 8/2014 | Rachmady | H01L 29/42392 257/24 |
| 2017/0005176 A1* | 1/2017 | Sung | H01L 21/3065 |
| 2017/0005180 A1* | 1/2017 | Cheng | H01L 29/775 |
| 2017/0005195 A1* | 1/2017 | Ching | H01L 29/7848 |

* cited by examiner

US 10,283,638 B2

STRUCTURE AND METHOD TO ACHIEVE LARGE STRAIN IN NS WITHOUT ADDITION OF STACK-GENERATED DEFECTS

CROSS-REFERENCE TO RELATED APPLICATION

This patent application claims the priority benefit under 35 U.S.C. § 119(e) of U.S. Provisional Patent Application No. 62/200,335 filed on Aug. 3, 2015, the disclosure of which is incorporated herein by reference in its entirety.

TECHNICAL FIELD

The present disclosure relates to semiconductor devices. More particularly, the present disclosure relates to stacks of nanowires and/or nanosheets formed on an underlayer having a lattice parameter that substantially matches the lattice parameter that a stack of nanosheets would have if the stack was allow to relax coherently.

BACKGROUND

Strained semiconductor materials may provide improved current transport characteristics in semiconductor devices, such as field effect transistors (FETs). Compressive strain in a channel of an FET may provide increased hole mobility for p-channel FETs, whereas tensile strain in a channel of an FET may provide increased electron mobility for n-channel FETs.

SUMMARY

An exemplary embodiment provides a stack for a semiconductor device that comprises a plurality of sacrificial layers in which each sacrificial layer comprises a first lattice parameter; at least one channel layer comprising a second lattice parameter that is different from the first lattice parameter, and in which each channel layer is disposed between and in contact with two sacrificial layers; and an underlayer on which the plurality of sacrificial layers and the at least one channel layer are disposed in which a sacrificial layer is in contact with the underlayer, and in which the underlayer comprises a third lattice parameter that substantially matches the lattice parameter that the plurality of sacrificial layers and the at least one channel layer would have if the plurality of sacrificial layers and the at least one channel layer were was allow to relax coherently. The underlayer does not generate substantially any defects in the plurality of sacrificial layers and the at least one channel layer except for any prolongation into the stack of defects present in the underlayer.

Another exemplary embodiment provides a stack for a semiconductor device that comprises a plurality of sacrificial layers in which each sacrificial layer comprises a first lattice parameter, a first end, a second end, and a cross-sectional area oriented in a direction that is substantially perpendicular to a direction between the first and second ends of the at least one sacrificial layer, and in which the cross-sectional area of each sacrificial layer comprises a first thickness and a first width that is substantially perpendicular to the first thickness, and in which the first thickness of each sacrificial layer is less than a metastable critical thickness for a material of the sacrificial layer; at least one channel layer comprising a second lattice parameter, a first end, a second end, and a cross-sectional area oriented in a direction that is substantially perpendicular to a direction between the first and second ends of the at least one channel layer, in which the second lattice parameter is different from the first lattice parameter, in which each channel layer is disposed between and in contact with two sacrificial layers, and in which the cross-sectional area of each channel layer comprises a second thickness and a second width that is substantially perpendicular to the second thickness, and in which the second thickness of each channel layer is less than a metastable critical thickness for a material of the channel layer; and an underlayer on which the plurality of sacrificial layers and the at least one channel layer are disposed, in which a sacrificial layer is in contact with the underlayer, and in which the underlayer does not generate substantially any defects in the plurality of sacrificial layers and the at least one channel layer, other than any prolongation of defects that were present in the underlayer prior to deposition of the stack.

Yet another exemplary embodiment provides a method to form a stack for a semiconductor device in which the method comprises providing an underlayer; forming a stack of a plurality of sacrificial layers and at least one channel layer on the underlayer in which a sacrificial layer is in contact with the underlayer, in which each sacrificial layer comprises a first lattice parameter, in which the at least one channel layer comprises a second lattice parameter that is different from the first lattice parameter, in which each channel layer is disposed between and in contact with two sacrificial layers, and in which the underlayer comprises a third lattice parameter that substantially matches the lattice parameter that the plurality of sacrificial layers and the at least one channel layer would have if the plurality of sacrificial layers and the at least one channel layer were allow to relax coherently.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1A:
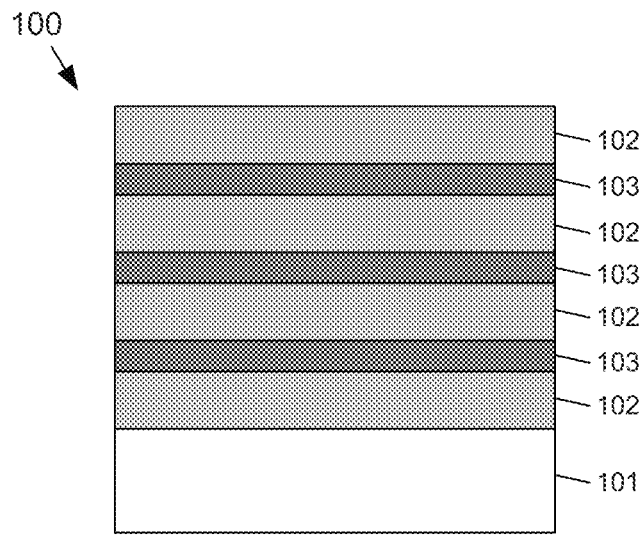
FIGS. 1A-1D respectively depict an exemplary stack of strained-channel nanosheets at selected stages of formation as described by the method of FIG. 2 according to the subject matter disclosed herein.

The subject matter disclosed herein relates to stacks of nanowires and/or nanosheets formed on an underlayer having a lattice parameter that substantially matches the lattice parameter that a stack of nanosheets would have if the stack was allow to relax coherently. As used herein, the phrase "substantially matches" generally means a lattice parameter mismatch of about 0.2% or less, and in some embodiments the phrase "substantially matches" can mean a lattice parameter mismatch of about 0.5% or less. The term "mismatch," as used herein, means a lattice parameter mismatch between the underlayer lattice parameter and the lattice parameter that a stack would have if allowed the stack to relax coherently. The role of the underlayer is not to directly strain the layers of the stack because the strain generated in the stack is mainly determined by the stack itself (i.e., the sacrificial and channel layers of the stack), and not by the underlayer of the stack. One function of the underlayer may be to inhibit the stack from plastically relaxing by introduction of new defects in the stack.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment is included in at least one embodiment disclosed herein. Thus, the appearances of the phrases "in one embodiment" or "in an embodiment" or "according to one embodiment" (or other phrases having similar import) in various places throughout this specification are not necessarily all referring to the same embodiment. As used herein, the word "exemplary" means "serving as an example, instance, or illustration." Any embodiment described herein as "exemplary" is not to be construed as necessarily preferred or advantageous over other embodiments. Furthermore, the particular features, structures, or characteristics may be combined in any suitable manner in one or more embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

The subject matter disclosed herein relates to devices, such as, but not limited to, field effect transistors (FETs), that contain one or more stacks of nanowires (NWs) and/or one or more stacks of nanosheets (NS s). As used herein, the term "nanowire" means a conductive structure having a cross-sectional area that is substantially perpendicular to the direction of current transport through the nanowire and in which the Cartesian cross-sectional dimensions are similar and small. For example, a nanowire may comprise a conductive structure having a cross-sectional area in which the Cartesian cross-sectional dimensions may range from a few nanometers to about 20 nm. Also as used herein, the term "nanosheet" means a conductive structure having a cross-sectional area that is substantially perpendicular to the direction of current transport through the nanosheet, and in which one of the Cartesian cross-sectional dimensions is noticeably smaller in comparison to the other dimension. For example, a nanosheet may comprise a conductive structure have a cross-sectional area in which one of the Cartesian cross-sectional dimensions ranges from a few namometers to about 20 nm and the other Cartesian cross-sectional dimensions ranges from about 15 nm to about 70 nm. As used herein, the terms "nanowire" and "nanosheet" may be used interchangeably. Further, the terms "nanowire" and "nanosheet" may be referred to herein as layers. Regarding the term "stack," the term "stack" as used herein may refer to a plurality of sacrificial layers and a plurality of channel layers having dimensions consistent with being either nanowires and/or nanosheets, and that are formed in a stack of an alternating sequence of sacrificial layers and channel layers.

The subject matter disclosed herein more particularly relates to stacks of nanowires and/or nanosheets formed on an underlayer having a lattice parameter that substantially matches the lattice parameter that a stack of nanosheets would have if the stack was allow to relax coherently. Such an underlayer may comprise, but is not limited to a strain-relaxed buffer (SRB), an elastically strained buffer or any underlayer material comprising a lattice parameter that a stack of nanosheets would have if the stack was allow to relax coherently. According to the subject matter disclosed herein, the role of the underlayer is not to directly strain the layers of the stack. The strain generated in the stack is mainly determined by the stack itself (i.e., the sacrificial and channel layers of the stack), and not by the underlayer of the stack. One function of the underlayer may be to inhibit the stack from plastically relaxing by introduction of defects into the stack from the underlayer.

Figure 1B:
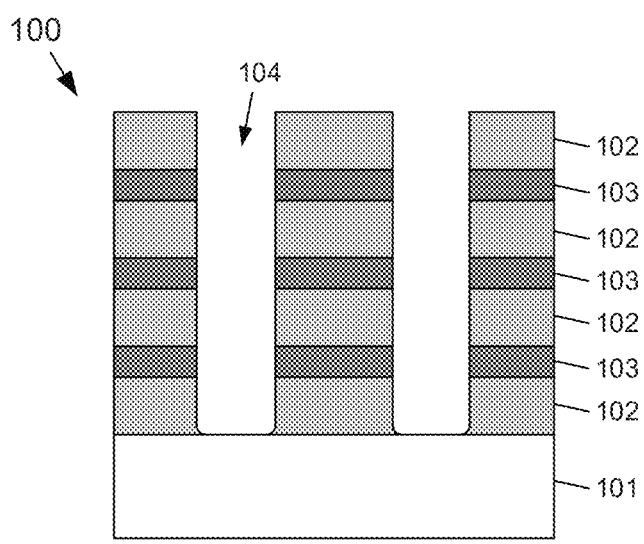
Figure 1C:
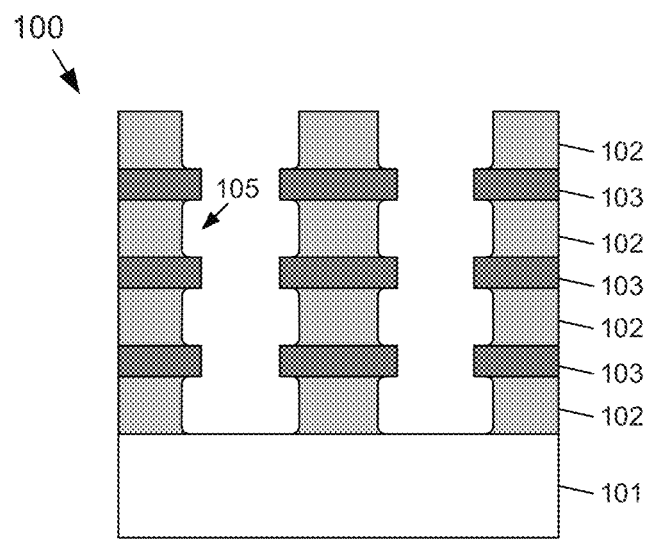
Figure 1D:
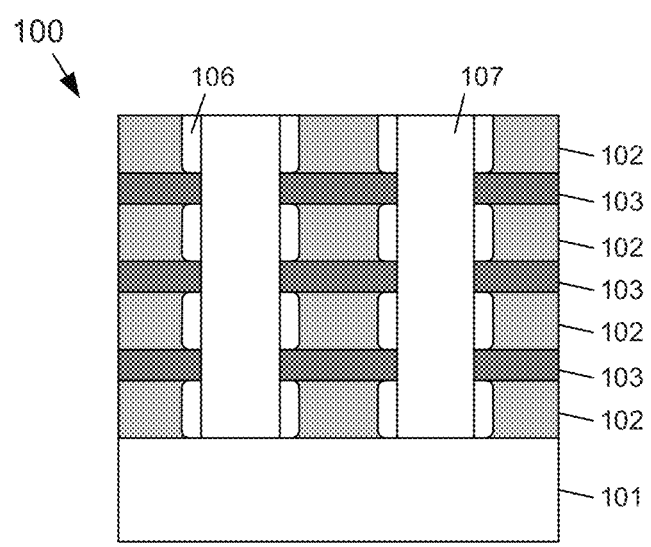
Figure 2:
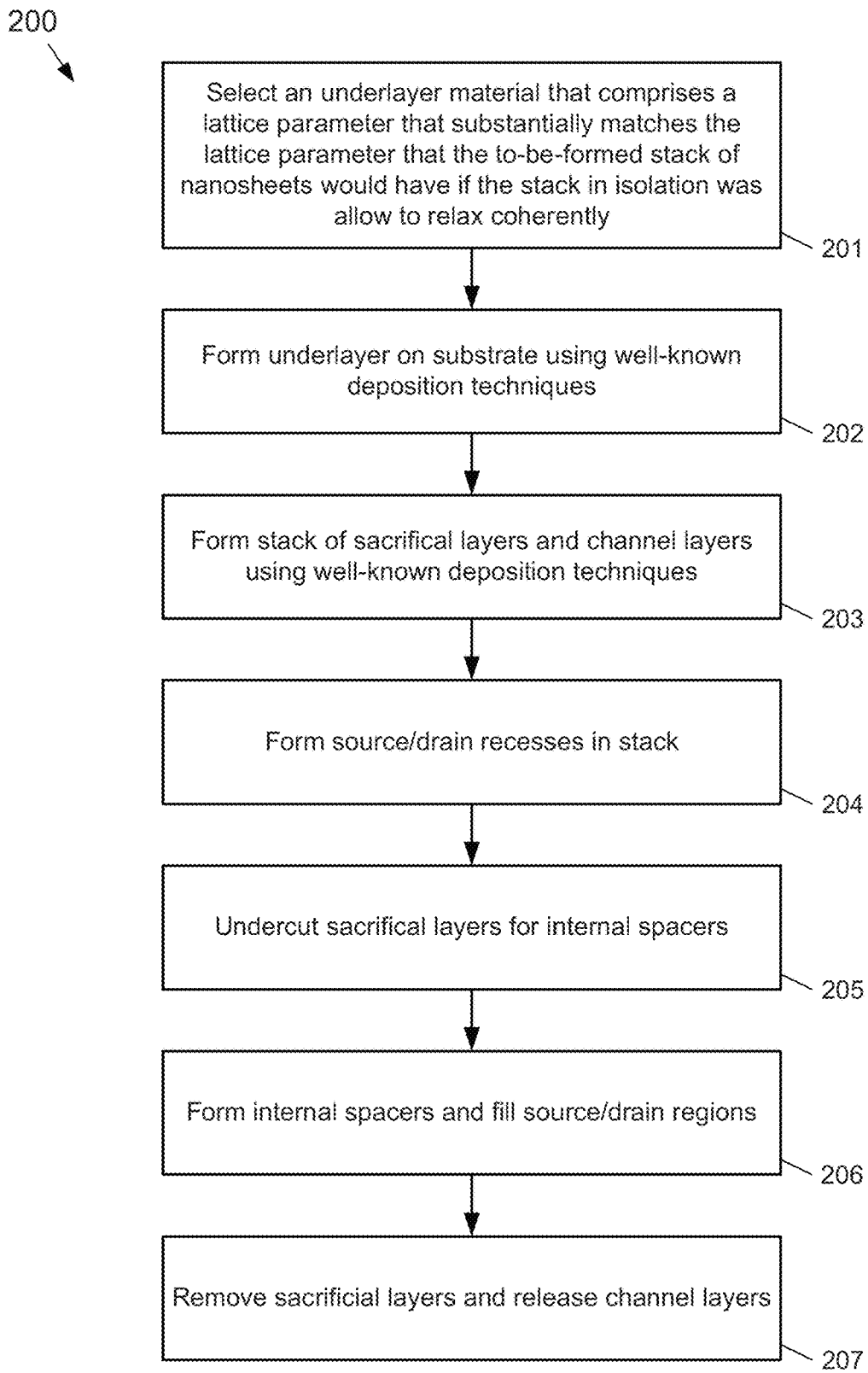
FIG. 2 depicts a flow diagram of an exemplary method to form a stack of strained-channel nanosheets that comprises substantially no stack-generated defects in the nanosheets according to the subject matter disclosed herein.

FIGS. 1A-1D respectively depict an exemplary stack 100 of strained-channel nanosheets at selected stages of formation as described by the method of FIG. 2 according to the subject matter disclosed herein. FIG. 2 depicts a flow diagram of an exemplary method 200 to form a stack of strained-channel nanosheets that comprises substantially no stack-generated defects in the nanosheets according to the subject matter disclosed herein. A stack of strained-channel nanosheets according to the subject matter disclosed herein may be utilized in semiconductor devices, such as, but not limited to, FETs.

Referring to FIGS. 1A-1D and 2, at operation 201 in FIG. 2, an underlayer material is selected that comprises a lattice parameter that substantially matches the lattice parameter that the to-be-formed stack of nanosheets would have if the stack in isolation was allow to relax coherently. As used herein, the term "underlayer" means a strain-relaxed buffer (SRB), an elastically strained buffer, or any underlayer material comprising a lattice parameter that substantially matches the lattice parameter that the to-be-formed stack would have if the stack in isolation was allow to relax coherently. Examples of an underlayer include, but are not limited to, strained Silicon on Insulator (sSOI), SiGeOI, or a layer of group IV atoms or of non-group IV atoms, or of III-V materials or II-VI materials. Underlayers may be on insulators or grown from the substrate (with possibly other layers in between the underlayer and the substrate). Typically, underlayers are substantially single crystals.

At operation 202, an underlayer 101 is formed on, for example, a substrate (not shown), using well-known deposition techniques. The underlayer 101 is formed from the material selected at operation 201.

At operation 203, a stack 100 of sacrificial layers 102 and channel layers 103 is formed epitaxially on the underlayer 101 using well-known deposition techniques. The sacrificial layers 102 and the channel layers 103 are formed in an alternating sequence in which a sacrificial layer 103 is formed directly on the underlayer 101. In one exemplary embodiment, the stack 100 comprises a top sacrificial layer 102 formed on a channel layer 103.

The sacrificial layer material and the channel layer material are selected based on the amount of and the type of strain that is to be imparted to the channel layers. If the channel layers are to have a tensile strain, the material selected for the sacrificial layers will have a lattice parameter (in its relaxed state) that is greater than the lattice parameter (in its relaxed state) of the material selected for the channel layers. Conversely, if the channel layers are to have a compressive strain, the material selected for the sacrificial layers will have a lattice parameter (in its relaxed state) that is less than the lattice parameter (in its relaxed state) of the material selected for the channel layers. The compositions and lattice parameters of the sacrificial and channel layer materials may also be based on flow integration constraints, such as, but not limited to etch selectivity, ability to grow epi layers, and the stress desired (larger lattice parameter mismatch (in their relaxed states) between channel and sacrificial layers leading to larger strain).

The sacrificial layers 102 and the channel layers 103 are formed to have thicknesses that are less than the metastable, or kinetic, critical thickness for the respective materials selected when constrained to have the lattice parameter of the material on which the layer is formed so that the respective layers will not plastically relax and generate intra-layer defects. The thicknesses of the channel and sacrificial layers 103 should also be selected to optimize the characteristics, such as, but not limited to, the performance of the final device, ability to fit a replacement gate stack in between the channel layers, an aspect ratio of the stack, and strain considerations.

The respective thicknesses and the respective lattice parameters of the sacrificial and channel layers will physically combine in the stack so that the stack will have an overall lattice parameter that is based on a weighted average of the lattice parameters of the sacrificial and channel layers. The weighted average of the lattice parameters will be the lattice parameter that the stack of nanosheets would have if the stack in isolation was allowed to relax coherently. Thus, the material and specific implementation selected for the underlayer should ideally result in a lattice parameter that is substantially equal to the lattice parameter that the stack of nanosheets would have if the stack in isolation was allow to relax coherently. For example, if the stack that will be formed is for an nMOS device, the channel layers may comprise Si and the sacrificial layers may comprise SiGe. As another example, if the stack that will be formed is for a pMOS device, the channel layers may comprise SiGe and the sacrificial layers may comprise Si. For a pMOS device comprising SiGe channels and Si sacrificial layers, the stack is dominated by Si sacrificial layers, which are in their lowest strain energy state by keeping the lattice parameter of the substrate (Si). These structures, with ~5 nm SiGe channel layers are extremely robust against defect generation (in most cases thermodynamically stable). In practice, the limitations on Ge content in the SiGe channels are based on band-to-band tunneling (BTBT) and parasitic bipolar effect (PBE) considerations, and not from defect generation.

FIG. 1A depicts a stack 100 formed on an underlayer 101 after operation 203 in FIG. 2. The stack 100 comprises a stack of sacrificial layers and channel layers alternatingly formed on each other. In one exemplary embodiment, the stack 100 comprises a top sacrificial layer 102 formed on a channel layer 103.

At operation 204, source/drain recesses (or structure cuts) are formed in the stack 100 using well-known techniques to form spaces 104 for source/drain regions. It should be understood that only one of spaces 104 for the source/drain regions is indicated in FIG. 1B. The spaces 104 for the source/drain regions extend through the stack 100 to about the underlayer 101.

The regions of stack material left between the spaces 104 for the source/drain regions are relatively short (e.g., less than about 100 nm), so that the remaining regions of stack material are substantially completely elastically relaxed. The strain in the channel layers of the regions of remaining stack material is primarily determined by elastic deformation of the stack at the point that the source/drain recesses (or structure cut) are formed (i.e., operation 204). In particular, the strain in the channel layers is a function of the respective thicknesses of the sacrificial and channel layers, and their respective compositions. The strain state (or a desired portion of the strain state) of the remaining regions of stack material can be maintained throughout the rest of a manufacturing flow.

A larger difference in lattice parameter between the sacrificial and channel layers results in higher levels of resulting strain in the channel. For the example of Si/SiGe stacks, a larger difference in Ge content between the sacrificial material and channel material results in larger final channel strain. For example, for a stack comprising 5 nm thick channel layers, 15 nm thick sacrificial layers and $|\Delta Ge_{content}| \approx 25\%$, the peak strain in the channel layers is ~0.76%. In contrast, for a stack comprising the same thicknesses of channel and sacrificial layers, and for $|\Delta Ge_{content}| \approx 40\%$, the peak strain in the channel layers is ~1.2%.

At operation 205, the edges of the sacrificial layers 102 that were exposed when the spaces 104 for the source/drain regions were formed are etched, or undercut, using well-known techniques to remove a portion 105 of each sacrificial layer 102 between neighboring channel layers 103 to subsequently form internal spacers. It should be understood that only one undercut portion 105 of a sacrificial layer 102 is indicated in FIG. 1C. The depth of the etching of the sacrificial layers is selected to optimize $C_{para}$, $R_{para}$ and the desired strain in the channel layers. That is, as the sacrificial layer 102 is etched back from the exposed edge of the stack, the ends of channel layers will elastically relax to the natural lattice parameter of the material selected for the channel layers because the portions of the sacrificial layers that have been etched away no longer impart the lattice parameter (and strain) of the sacrificial layer to the channel layers.

For an exemplary embodiment in which the channel layer length is about 20 nm or less, the internal spacer width (i.e., the amount of sacrificial material that is undercut), should be limited to, for example, less than about 8 nm. As the length of the channel material decreases from about 20 nm, the undercut of the sacrificial layer should be limited to be less than about 5 nm. In some embodiments, with shorter channels, the undercut of the sacrificial layer should be limited to be less than 3 nm. The strain in channel layers is controlled by the relaxed state of the whole stack itself (before release), which in turn is controlled by the thicknesses and composition of the channel and sacrificial layers. Note that, because the final strain in the channels is controlled by the stack itself, the role of the underlayer in directly determining the final channel strain is substantially negligible.

Referring back to FIGS. 1A-1D and 2, at operation 206, internal spacers 106 are formed in the recesses 105 (FIG. 1C) of the sacrificial layers 102, and a well-known epitaxial regrowth technique is used to fill the spaces 104 (FIG. 1B) of the source/drain regions with a semiconductor material 107. The internal spacers may comprise but are not limited to, for example, silicon nitride or a low-k dielectric material such as, but not limited to SiOCH, SiOCN or SiBCN. Formation of the source and drain regions may be done in a way to maintain the source/drain regions substantially in a relaxed state and to not change substantially the strain state in the channel.

The filled source/drain regions 107 are physically coupled to the ends of the channel layers 103 and the physical presence of the filled source/drain regions 107 maintains the strain in the channel layers 103. The resulting strain in a channel layer 103 is, as mentioned, a function of the respective layer thicknesses of the sacrificial and channel layers, and their respective composition. A larger difference in lattice parameter between the sacrificial and channel layers results in higher levels of resulting strain in a channel layer 103.

The channel layers 103 are released by removal of the sacrificial layers 102 using well-known techniques. At channel layer release, it is important that the geometry and boundary conditions are such that the strain is kept in the channel layers. For process flows in which a source/drain structure 107 is grown epitaxially before release of the channel layers, the source/drain structure 107 helps maintain the strain in the channels after release. If, for example, a tall source/drain pillar structure 107 is coupled to channel layers 103 on only one side of the channel layers, then the source/drain pillar structure 107 may bend at the channel layer release by the effect of the channel stress. If, however, channel layer structures 103 are formed substantially symmetrically on both sides of a source/drain pillar structure, such as depicted for the source/drain structure 107 in FIG. 1D, then the source/drain pillar structure will be substantially balanced and will not substantially bend upon release of the channel layers.

At operation 207, the sacrificial layers 102 are removed (i.e., channel layer release) as part of, for example, a well-known replacement gate process. After removal of the sacrificial layers 102, the strain in the channel layers 103 is re-distributed so that the strain in each channel layer 102 becomes substantially homogeneous. That is, because the force along the length of the channel layers 103 is balanced, the stress, which is force per unit area, is inversely proportional to the cross-section of the channel layers. Thus, the strain in a channel layer will be uniform as long as the cross-sectional area of the channel layer is uniform. Otherwise, the strain in a channel layer will be inversely proportional to the cross-sectional area of the channel layer. Accordingly, after release of the channel layers, selective trimming of the cross-sectional area of a channel layer can be used to increase channel strain (i.e., channel strain is inversely proportional to the cross-section area of the channel layer).

Figure 3:
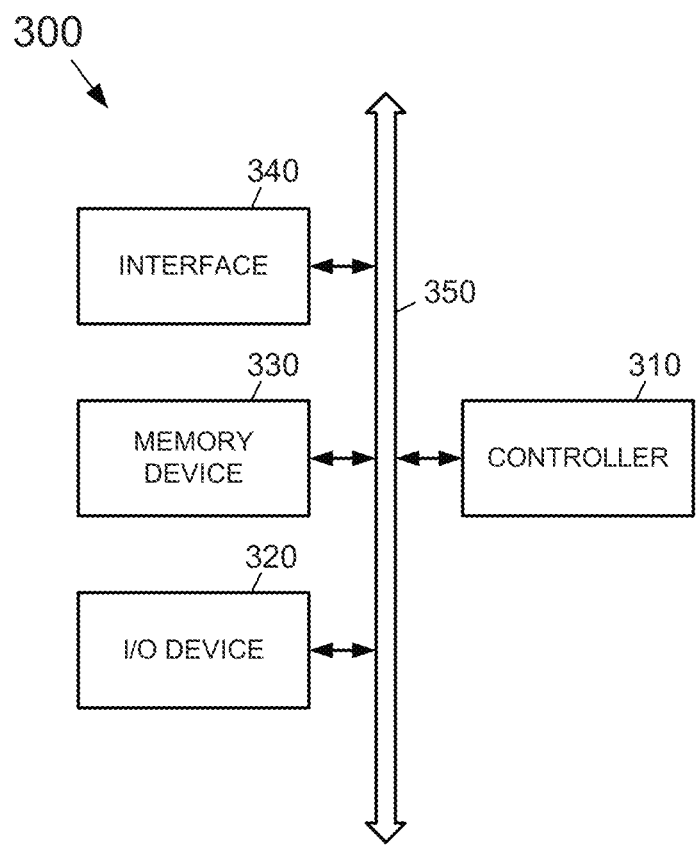
FIG. 3 depicts an electronic device that comprises one or more integrated circuits (chips) comprising one or more stacks of nanowires and/or nanosheets formed according to exemplary embodiments disclosed herein.

FIG. 3 depicts an electronic device 300 that comprises one or more integrated circuits (chips) comprising one or more stacks of nanowires and/or nanosheets formed according to exemplary embodiments disclosed herein. Electronic device 300 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 300 may comprise a controller 310, an input/output device 320 such as, but not limited to, a keypad, a keyboard, a display, or a touch-screen display, a memory 330, and a wireless interface 340 that are coupled to each other through a bus 350. The controller 310 may comprise, for example, at least one microprocessor, at least one digital signal process, at least one microcontroller, or the like. The memory 330 may be configured to store a command code to be used by the controller 310 or a user data. Electronic device 300 and the various system components comprising electronic device 300 may comprise one or more stacks of nanowires and/or nanosheets formed according to exemplary embodiments disclosed herein. The electronic device 300 may use a wireless interface 340 configured to transmit data to or receive data from a wireless communication network using a RF signal. The wireless interface 340 may include, for example, an antenna, a wireless transceiver and so on. The electronic system 300 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS-TDD), High Speed Packet Access (HSPA), Evolution Data Optimized (EVDO), Long Term Evolution—Advanced (LTE-Advanced), Multichannel Multipoint Distribution Service (MMDS), and so forth.

Figure 4:
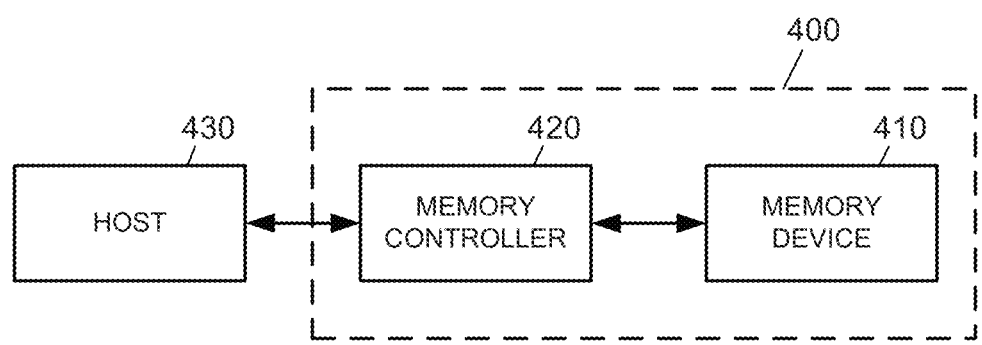
FIG. 4 depicts a memory system that may comprise one or more integrated circuits (chips) comprising one or more stacks of nanowires and/or nanosheets formed according to example embodiments disclosed herein.

FIG. 4 depicts a memory system 400 that may comprise one or more integrated circuits (chips) comprising one or more stacks of nanowires and/or nanosheets formed according to example embodiments disclosed herein. The memory system 400 may comprise a memory device 410 for storing large amounts of data and a memory controller 420. The memory controller 420 controls the memory device 410 to read data stored in the memory device 410 or to write data into the memory device 410 in response to a read/write request of a host 430. The memory controller 420 may include an address-mapping table for mapping an address provided from the host 430 (e.g., a mobile device or a computer system) into a physical address of the memory device 410. The memory device 410 may comprise one or more semiconductor devices according to exemplary embodiments disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A method of forming a stack for a semiconductor device, the method comprising:
    providing an underlayer;

forming a stack of a plurality of sacrificial layers and a plurality of channel layers alternately stacked on each other on the underlayer;

forming a first patterned stack, a second patterned stack and a space between the first patterned stack and the second patterned stack by patterning the stack, wherein the first patterned stack and the second patterned stack each includes a plurality of sacrificial patterns and a plurality of channel patterns alternately stacked one each other;

removing partially the plurality of sacrificial patterns through the space to form a plurality of undercut portions and a plurality of recessed sacrificial patterns;

forming a plurality of internal spacers to fill completely the plurality of undercut portions, wherein the plurality of internal spacers are in direct contact with the plurality of recessed sacrificial patterns;

forming a source/drain structure in the space after the forming of the plurality of internal spacers, wherein the source/drain structure is in direct contact with the plurality of sacrificial patterns and the plurality of internal spacers; and removing the plurality of recessed sacrificial patterns, wherein each of the plurality of sacrificial layers has a first thickness less than a metastable critical thickness for a material of the plurality of sacrificial layers, wherein each of the plurality of channel layers has a second thickness less than a metastable critical thickness for a material of the plurality of channel layers, wherein the underlayer does not generate substantially any defects in the plurality of sacrificial layers and the plurality of channel layers, except for any prolongation of defects present in the underlayer into the stack, and wherein the material of the plurality of sacrificial layers is one of Si and SiGe and the material of the plurality of channel layers is the other of Si and SiGe.

2. The method of claim 1, wherein each of the plurality of undercut portions is defined by a sidewall of one of the plurality of recessed sacrificial patterns and two adjacent channel patterns of the plurality of channel patterns, and wherein the one of the plurality of recessed sacrificial patterns is disposed between the two adjacent channel patterns.

3. The method of claim 2, wherein the each of the plurality of undercut portions has a predetermined depth to control strain of each of the plurality of recessed sacrificial patterns.

4. The method of claim 3, wherein the predetermined depth is less than about 3 nm.

5. The method of claim 1, wherein the plurality of internal spacers each includes silicon nitride or a low-k dielectric material including SiOCH, SiOCN or SiBCN.

6. The method of claim 1, wherein the first patterned stack, the second patterned stack and the space are arranged in a first direction, wherein the plurality of channel patterns each has a first length in the first direction, wherein the plurality of sacrificial patterns each has a second length in the first direction less than the first length of each of the plurality of channel patterns.

* * * * *